United States Patent [19]
Liu et al.

[11] Patent Number: 5,715,531
[45] Date of Patent: Feb. 3, 1998

[54] SYNCHRONOUS TRACKING FILTER CIRCUIT FOR A BROADCAST SATELLITE TUNER

[75] Inventors: Hai-Shen Liu; Tzu-Li Lu, both of Taipei; Ren-Yuh Liang, Yun-Lin Hsien, all of Taiwan

[73] Assignee: NextLevel Systems (Taiwan), Ltd., Hsin Tien, Taiwan

[21] Appl. No.: 560,901

[22] Filed: Nov. 20, 1995

[51] Int. Cl.⁶ .................................................. H04B 1/10
[52] U.S. Cl. .................. 455/307; 455/180.4; 455/191.2; 455/193.3; 455/340; 455/285; 455/3.2
[58] Field of Search .......................... 455/3.2, 180.4, 455/193.3, 193.2, 191.2, 191.1, 195.1, 196.1, 197.1, 197.2, 285, 286, 296, 302, 307, 327, 338, 339, 340; 333/177, 174; 334/15; 327/551, 552, 557

[56] References Cited

U.S. PATENT DOCUMENTS

| | | | |
|---|---|---|---|
| 4,662,001 | 4/1987 | Cruz et al. | 455/302 |
| 5,285,179 | 2/1994 | Wignot et al. | 455/191.2 |
| 5,619,283 | 4/1997 | Pugel | 455/191.2 |

*Primary Examiner*—Reinhard J. Eisenzopf
*Assistant Examiner*—Doris To
*Attorney, Agent, or Firm*—Volpe and Koenig, P.C.

[57] ABSTRACT

A synchronous tracking filter circuit for use in a broadcast satellite tuner that comprises four varactors and a strip-shaped inductor plate or pcb-printed strip line which produces a resonant frequency. The circuit is used in a doubly tuned resonant circuit to incorporate the tracking with the frequency changes of a voltage controlled oscillator (VCO) synchronously. The circuit can also control the image interference. This type of design is applicable in the tuner of an indoor broadcast satellite receiver unit to act as the synchronous tracking filter of input frequencies.

7 Claims, 12 Drawing Sheets

| Tuning Voltage | 2.35V | 2.6V | 3V | 4.1V | 6V | 10V | 16V | 17V |
|---|---|---|---|---|---|---|---|---|
| 1dB BW | 125MHz | 130MHz | 140MHz | 150MHz | 175MHz | 250MHz | 250MHz | 250MHz |
| Image Rejection | 38.5dB | 38.5dB | 37.5dB | 35dB | 31dB | 24.5dB | 22dB | 21.5dB |
| Insertion Loss | -4.5dB | -4.3dB | -4.1dB | -3.3dB | -2dB | -1.4dB | -1.53dB | -1.5dB |
| $f_{RF}$ | 930MHz | 950MHz | 980MHz | 1090MHz | 1295MHz | 1701MHz | 2035MHz | 2074MHz |
| $f_{o.s.c}$ | 1410MHz | 1430MHz | 1460MHz | 1570MHz | 1775MHz | 2180MHz | 2515MHz | 2555MHz |
| Return Loss (min) | — | — | 7dB | 7.6dB | 11dB | 17dB | 9.2dB | — |
| Reference Drawings | — | Fig. 4a､b | — | Fig. 5a､b | — | Fig. 6a､b | Fig. 7a､b | — |

Fig. 8

SYNCHRONOUS TRACKING FILTER CIRCUIT FOR A BROADCAST SATELLITE TUNER

BACKGROUND OF THE INVENTION

The present invention relates to a synchronous tracking filter circuit for a broadcast satellite receiver and more specifically, to a synchronous tracking filter for indoor broadcast satellite tuner units. The design adapts to the expansion of satellite frequency range and to effectively control image signals interference and reduce the second distortion of the mixer.

The rate of usage for satellite channels is continuously increasing. So far, the frequency ranges for broadcast tuners have increased from 950–1450 MHz to 950–2950 MHz. As the broadcast channels increase, so has the mixer loss and image signals interference. To control these signals, the application of synchronous tracking filter has become increasingly important. Since the design of a synchronous tracking filter is able to track and diminish the interfering signals, the filter is able to effectively prevent the image signals interference and improve the mixer loss. The following Table shows the basic requirements for a synchronous tracking filter:

TABLE 1

| Refer to RF input 950–2050 MHz and 1F output 479.5 MHz | |
| --- | --- |
| Image Rejection Ratio for 1910 MHz–2050 MHz | 30dB minimum |
| Image Rejection Ratio for 2050 MHz–3010 MHz. | 20dB minimum |
| RF Interference Rejection Ratio of the Second Distortion | 35dB Minimum |
| Tracking Range (Synchronous Tracking with VCO Frequency Change) | 950–2050 MHz |
| Insertion Loss in Tracking Range | 6dB Maximum |
| 1dB of a Fixed Resonance Frequency Width | 100 MHz Maximum |

Figure 2A:
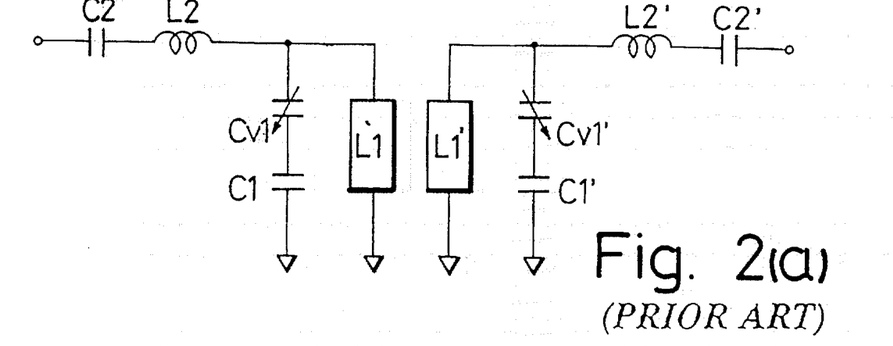
FIGS. 2(a)–(c) are the circuit layouts for the known synchronous tracking filters.
Figure 2B:
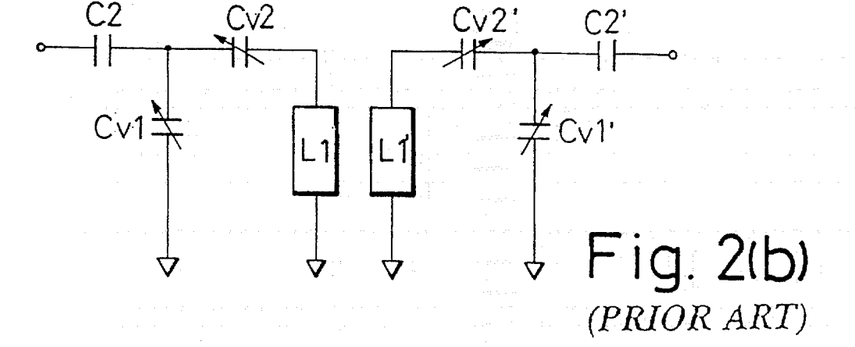
Figure 2C:
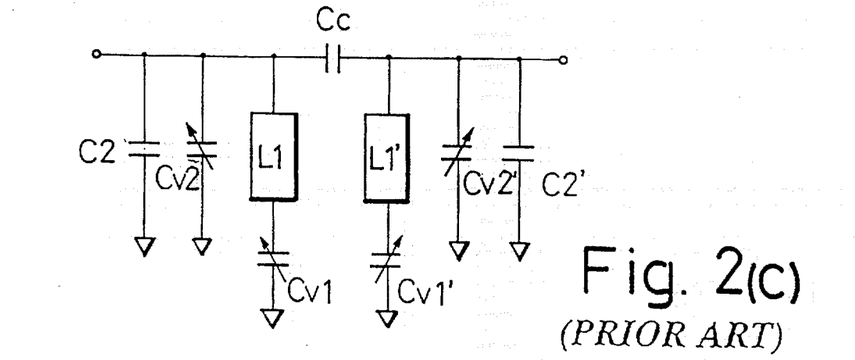

So far, companies that have developed the synchronous tracking filters to be used in broadcast satellite tuners include Siemens of Germany, ALPS of Japan and Anadigics of the U.S., and their circuit structures are shown in FIGS. 2a, 2b and 2c respectively. Because of the limitations in the circuits as mentioned in Table 1, these products have difficulties in the 2050 MHz high frequency satellite systems. In particular, these difficulties are mostly less-than-ideal limitations in tracking range and the insertion loss in the tracking range.

SUMMARY OF THE INVENTION

One object of the present invention is to provide a circuit apparatus for a synchronous tracking filter that includes a novel doubly tuned filter having four varactors in conjunction with a striped-shaped inductor plate or printed strip line to produce a tracking range of 950 MHz–2050 MHz and to comply with the region of insertion loss of the tracking range. The design of the present invention is able to comply with all the requirements of Table 1, and therefore is able to effectively prevent the image signals interference and the second distortion of the mixer.

Other features and advantages of the invention will be apparent from the following examples, in connection with the accompanying drawings wherein:

DETAILED DESCRIPTION OF THE PREFERRED EMBODIMENT

Figure 1:
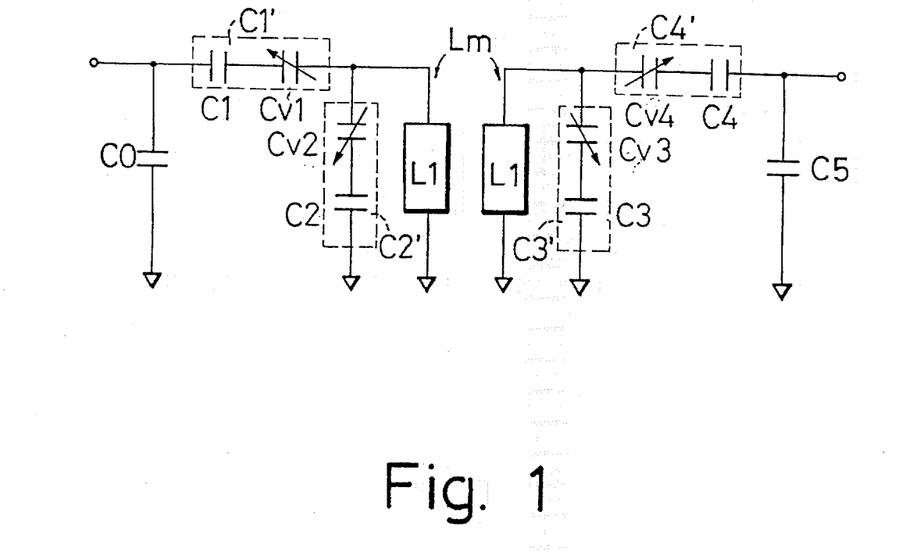
FIG. 1 is the circuit diagram of the present synchronous tracking filter.

From FIG. 1, it can be seen that the synchronous tracking filter circuit in accordance with the present invention is a double-resonant circuit. On the input end of the circuit, an inductor L1 is connected in parallel to a variable capacitor C2' and then connected to a variable capacitor C1' in series to form a single resonant circuit. The output end of the circuit structure has the same structure, i.e., an inductor L2 is connected in parallel to a variable capacitor C3' and then connected to a variable capacitor C4.

Each variable capacitor C1', C2', C3' and C4' is basically formed by connecting capacitors C1, C2, C3 and C4 in series to varactors Cv1, Cv2, Cv3 and Cv4, respectively. The purpose of the capacitor C* (* represents 1, 2, 3 and 4) is to isolate DC currents and to adjust the capacitance of the varactors Cv* to avoid not being able to supply low enough capacitance for high-end frequencies or high enough capacitance for low-end frequencies; either of which would affect the range that can be tracked. Input circuit (L1, C1', C2' and C0) and output circuit (L2, C3', C4' and C5) utilize the constant K (air coupling factor) to achieve the bandwidth. Capacitor C1' and C0 are able to form the C-tap, and match with the previous stage, while C4' and C5 are able to form the other C-tap, and match with the post stage. It is clear from FIG. 1 that the circuit structure of the present invention includes four varactors (show as Cv*; * denotes 1, 2, 3, and 4); this type of structure is completely different from the synchronous tracking filters currently on the market.

FIG. 2a depicts a circuit diagram of the tracking filter disclosed by the Siemens company. This circuit only includes two variable capacitors Cv1 and Cv1', which connect in series with C1 and C1' respectively, and further connect in parallel with L1 and L1' respectively. The circuit then connects in series with L2, C2 and L2', C2' respectively thereby forming a doubly resonant circuit. This circuit only depends on the changes of Cv1 and L1 or Cv1' and L1' to achieve resonance. Therefore, it is not easy to adequately obtain good tracking ranges up to 2.05 GHz.

FIG. 2b depicts the tracking filter of the ALPS company. Although this filter has four varactors, from the input end of the doubly resonant circuit, the circuit structure is one of inductor L1 connecting in series with a variable capacitor Cv2 and then connecting in parallel with a variable capacitor Cv1. This type of structure used to control capacitance is difficult for tracking high and low end frequencies, which would be difficult to meet the present requirements. The present invention circuitry structure is mainly based on parallel connections (L1 in parallel with C2' and L2 in parallel with C3'), and using serial connections to adjust (C2 adjusts C2', C1 adjusts C1', C3 adjusts C3', and C4 adjusts C4') so that it is able to easily have the required tracking range of 950 MHz–2050 MHz. Therefore, the circuit structure of ALPS's design and the present invention are different, and ALPS's design lacks the advantages of the present invention.

FIG. 2c depicts the design of Anadigics. The design, other than using inductor n1 to connect in series with a variable capacitor Cv1 and then in parallel with a capacitor C2, the capacitor Cc is connected in series with the inductor L1' of the output circuit. This structure is obviously different from the structure of the present invention.

Figure 3:
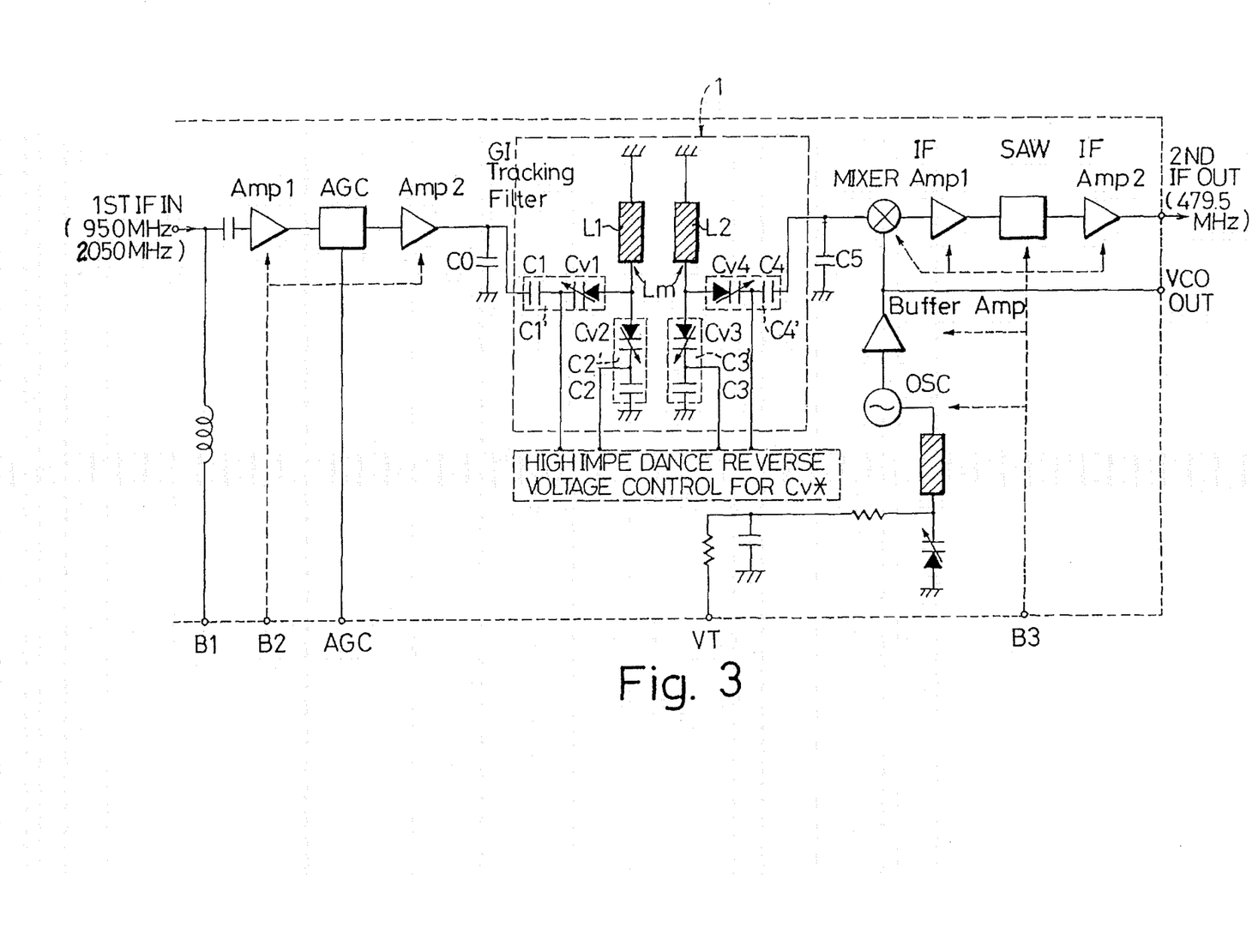
FIG. 3 is the block diagrams of the present synchronous tracking filter used in broadcast satellite tuners.

FIG. 3 shows the circuit diagrams of the present synchronous tracking filter used in broadcast satellite tuners. It is shown from the Figure that the present synchronous tracking filter is situated between an amplifier (Amp2) and a mixer of a BS-tuner to synchronously track the frequency signals of the input end. From this Figure, L1 and L2 represent inductors, and variable capacitors C1' ... C4' are formed by capacitors C1 ... C4 connecting in series with varactors Cv1 ... Cv4 respectively. The input end and output end utilize the coupling factor K to achieve the desired coupling. The present invention also connects to a high resistance inverse bias controller 2 to provide control voltage to the variable varactors Cv1 ... Cv4. The capacitors C1 ... C4 use the specific capacitances to adjust the output capacitance of the varactors Cv1 ... Cv4 for proper tuning. The variable capacitors C1' and C4' are still able to form the C-tap with the capacitor C0 and C5, and impedance matches for the tracking filter 1.

The present invention can also directly connect the capacitors C1' and C4' to the previous and post stages in a mismatch manner. Therefore, capacitors C0 and C5 are only a design choice of impedance matching, and not limited to the scope of the present invention. The present invention would track the input frequencies range by synchronized "VC0" tuning voltage which controls the Cv* of varactors. Furthermore, the inductors L1, L2 are not limited in that they can either be an inductor plate or printed strip line.

Figure 4A:
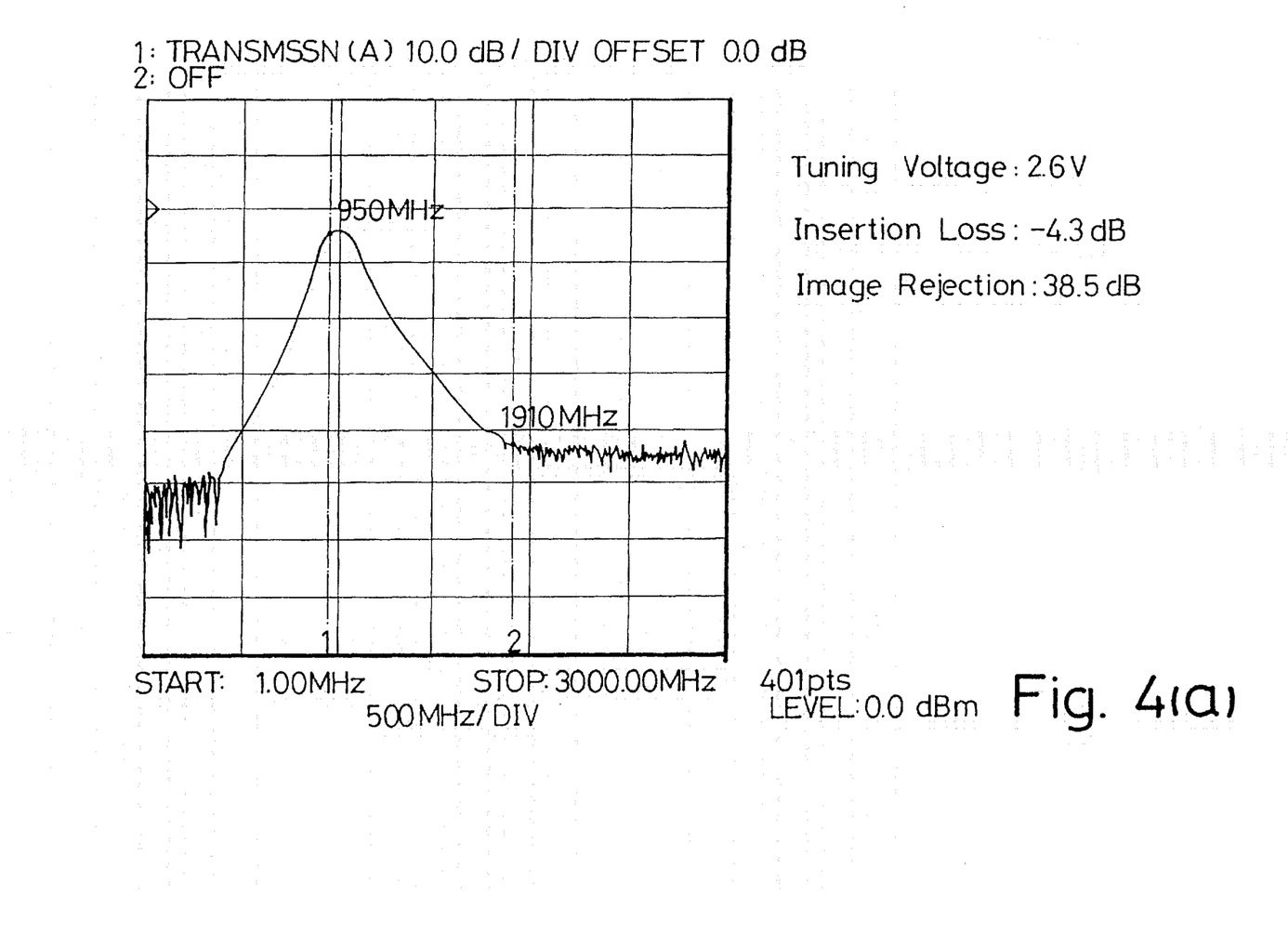
FIGS. 4(a)–(b), 5(a)–(b), 6(a)–(b), and 7(a)–(b), are data curves of actual measurements for the circuit apparatus of the present invention.
Figure 4B:
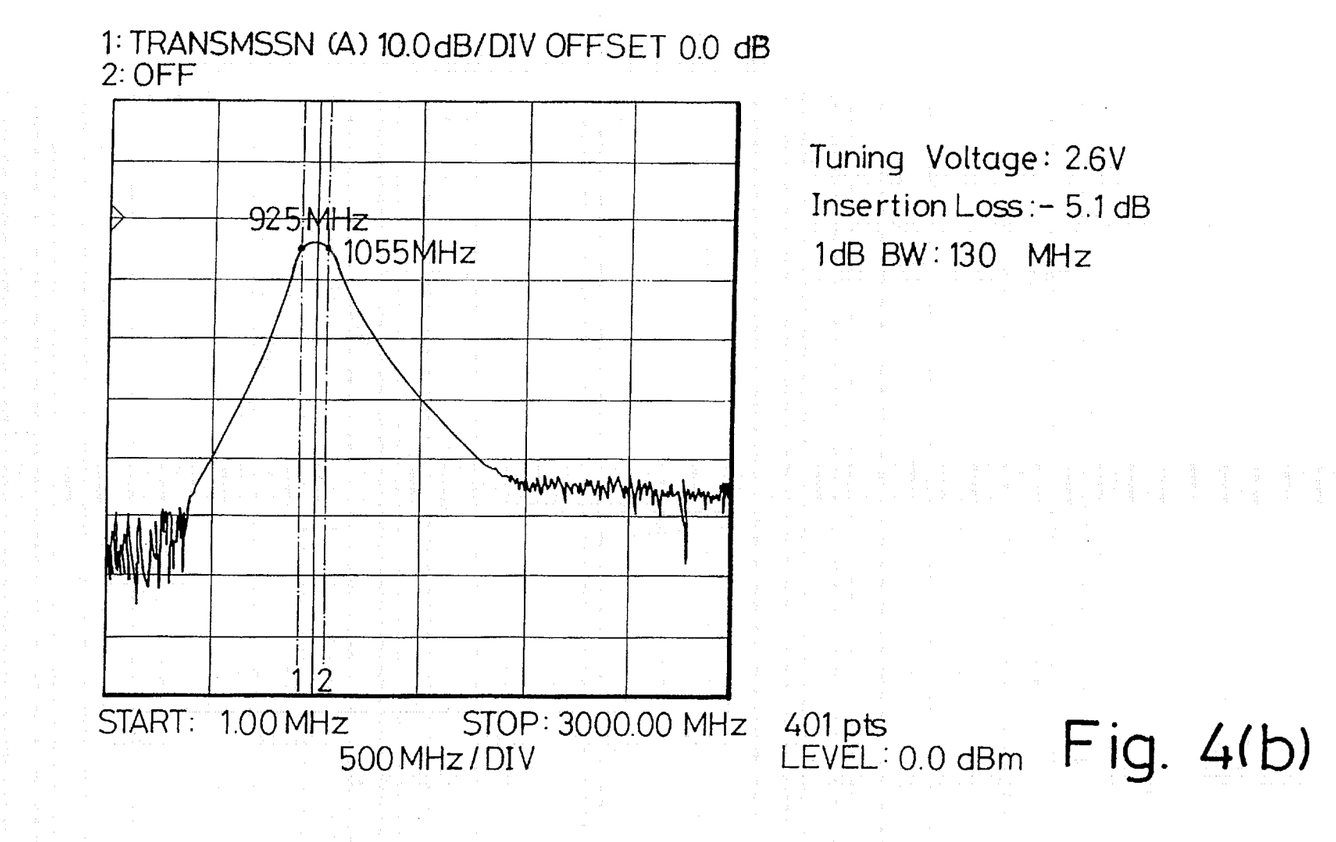
Figure 5A:
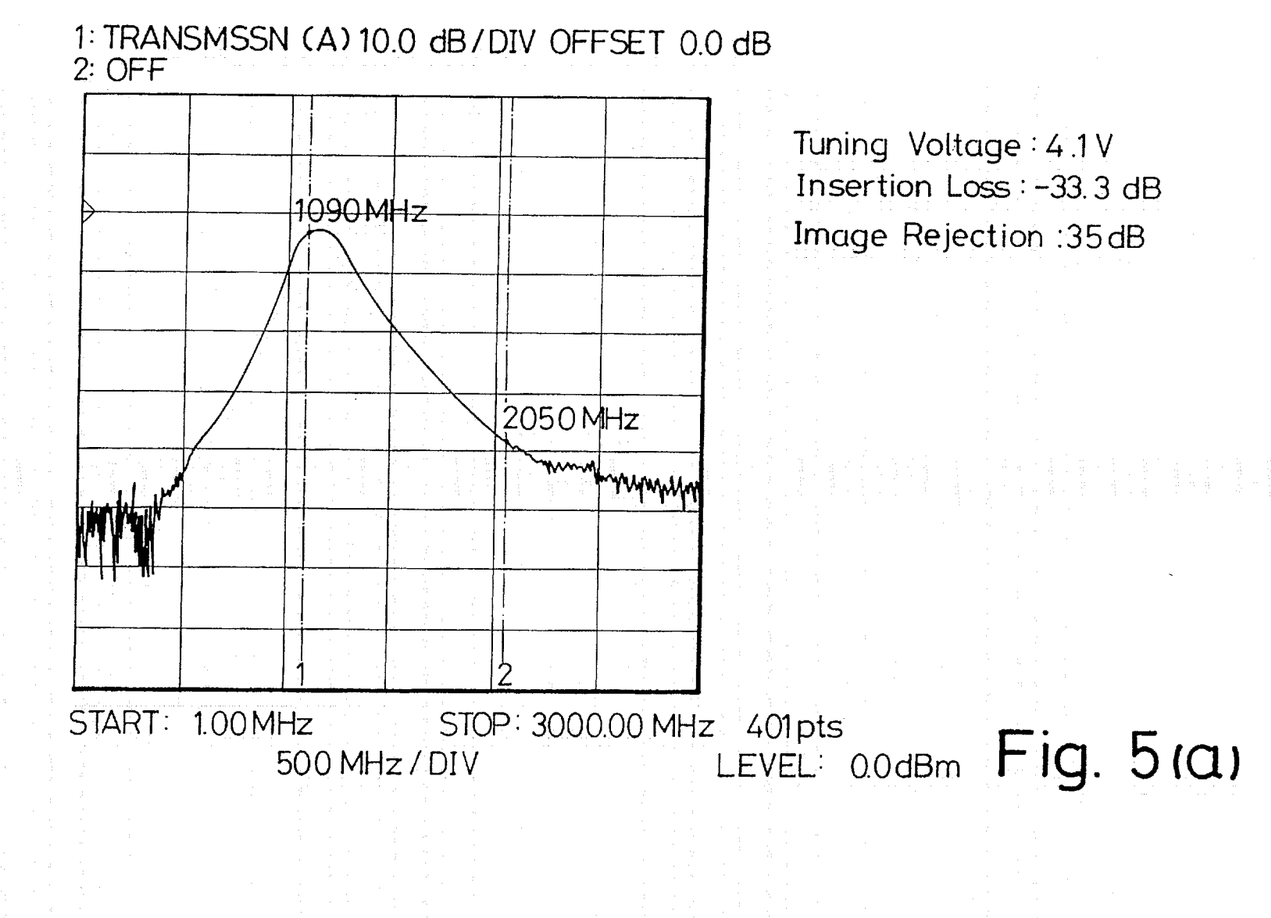
Figure 5B:
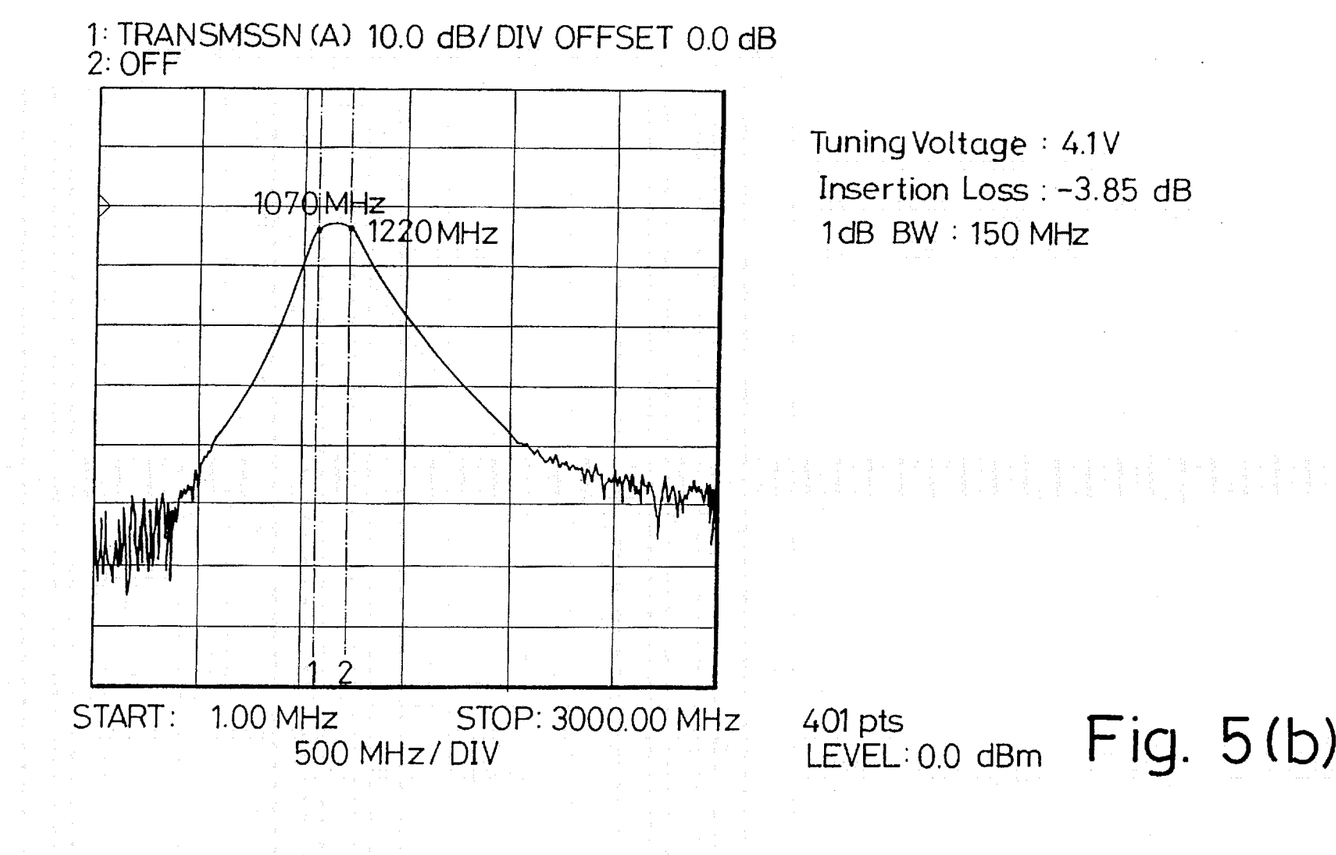
Figure 6A:
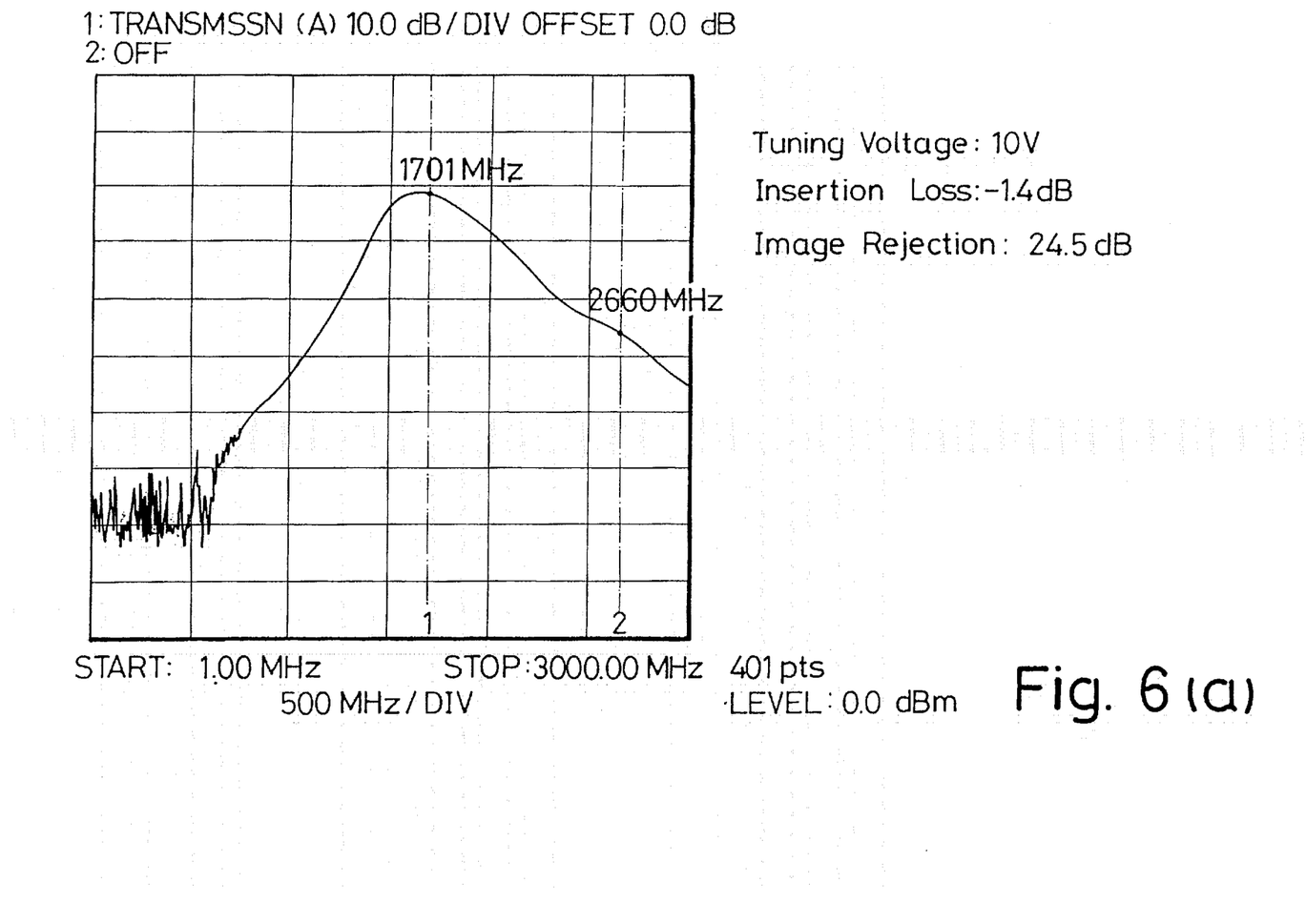
Figure 6B:
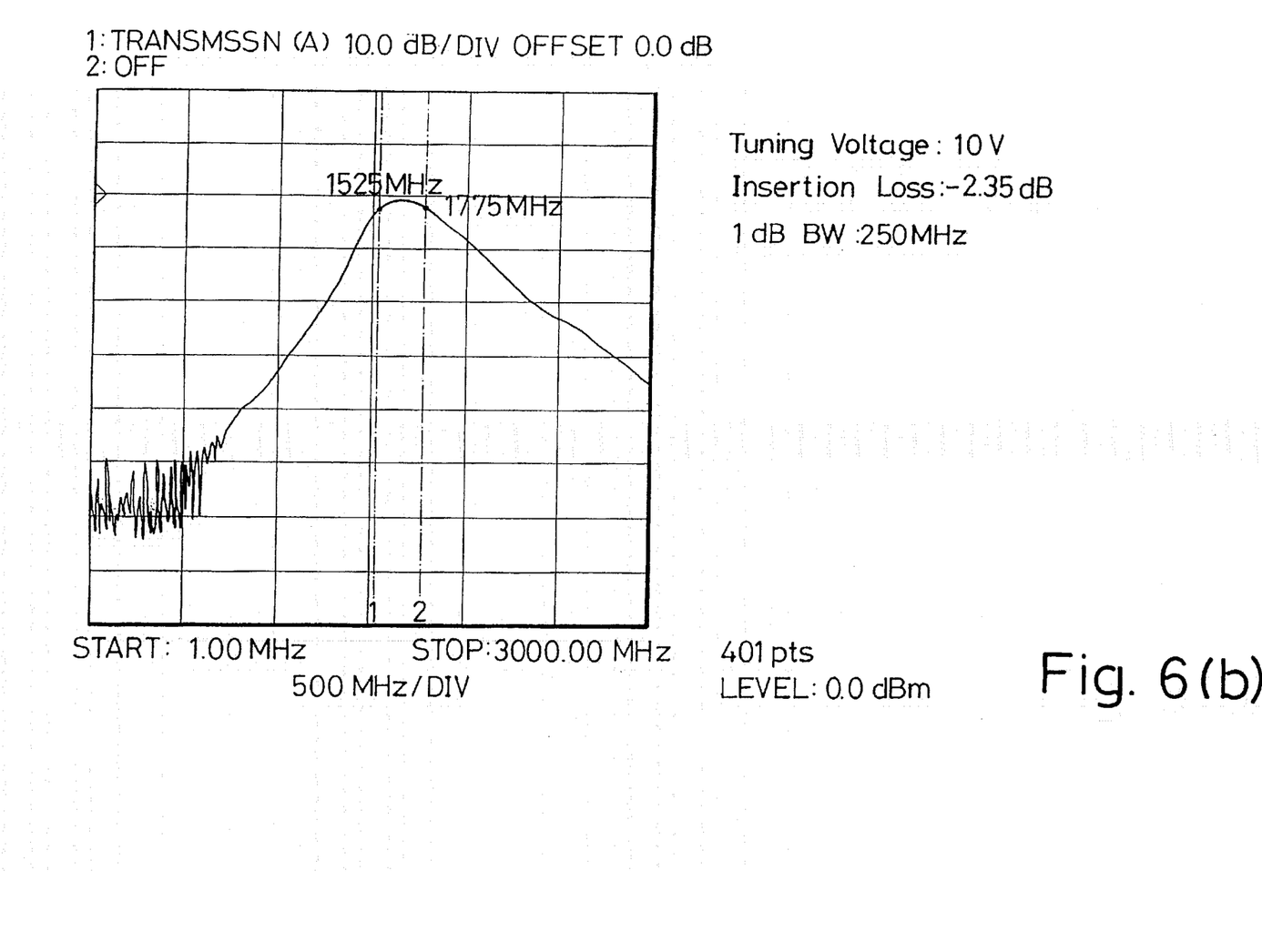
Figure 7A:
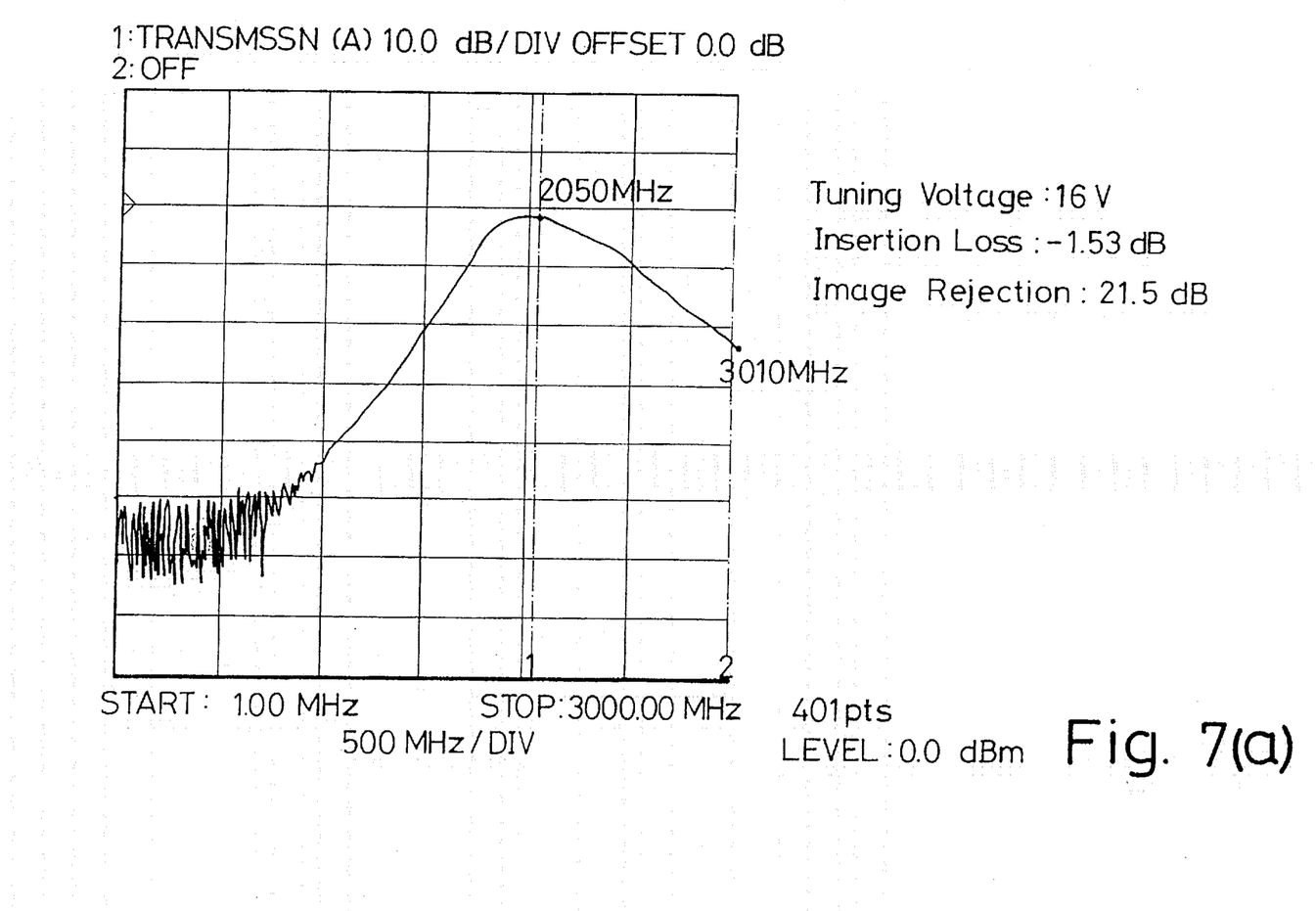
Figure 7B:
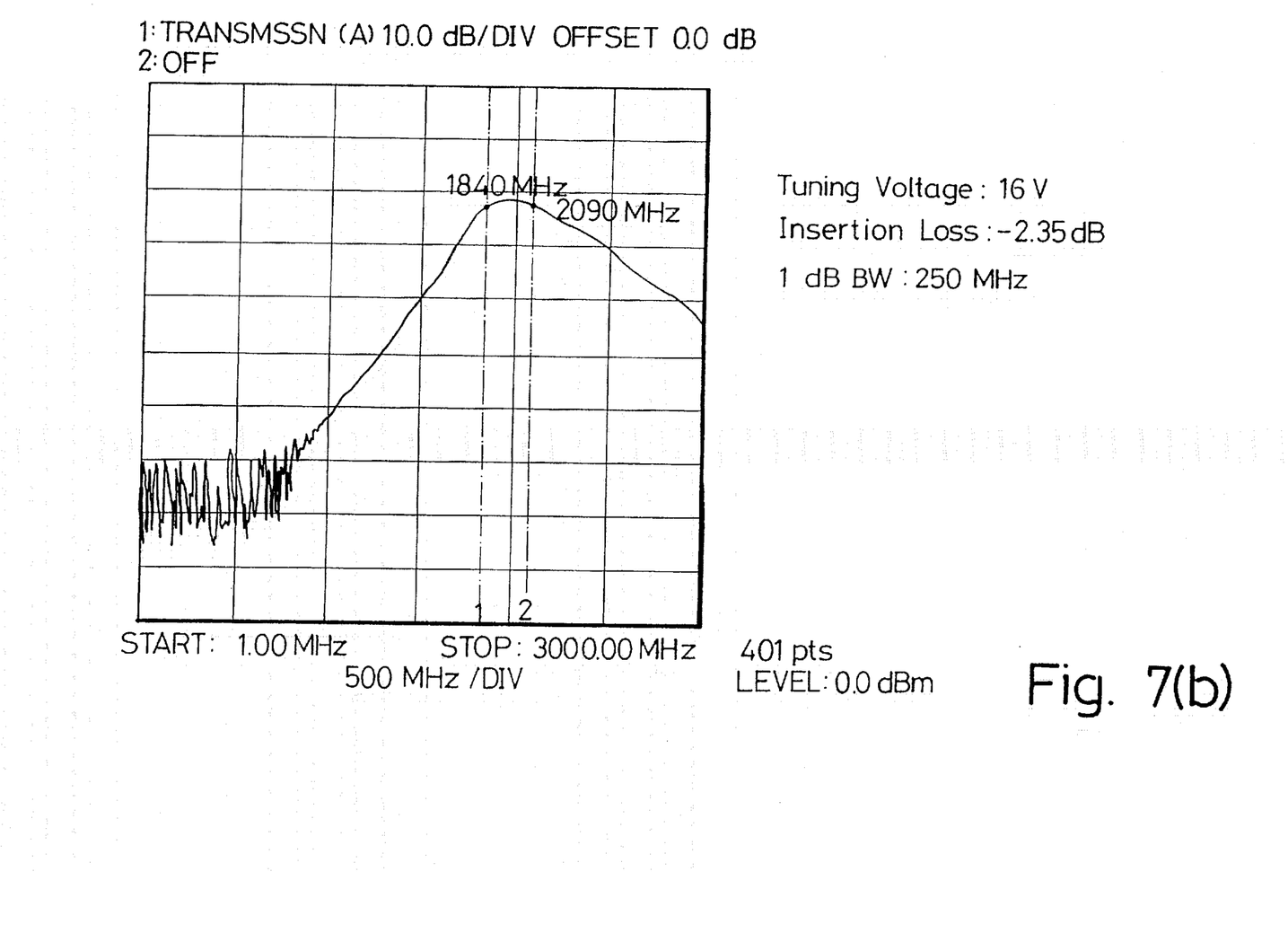
Figure 8:
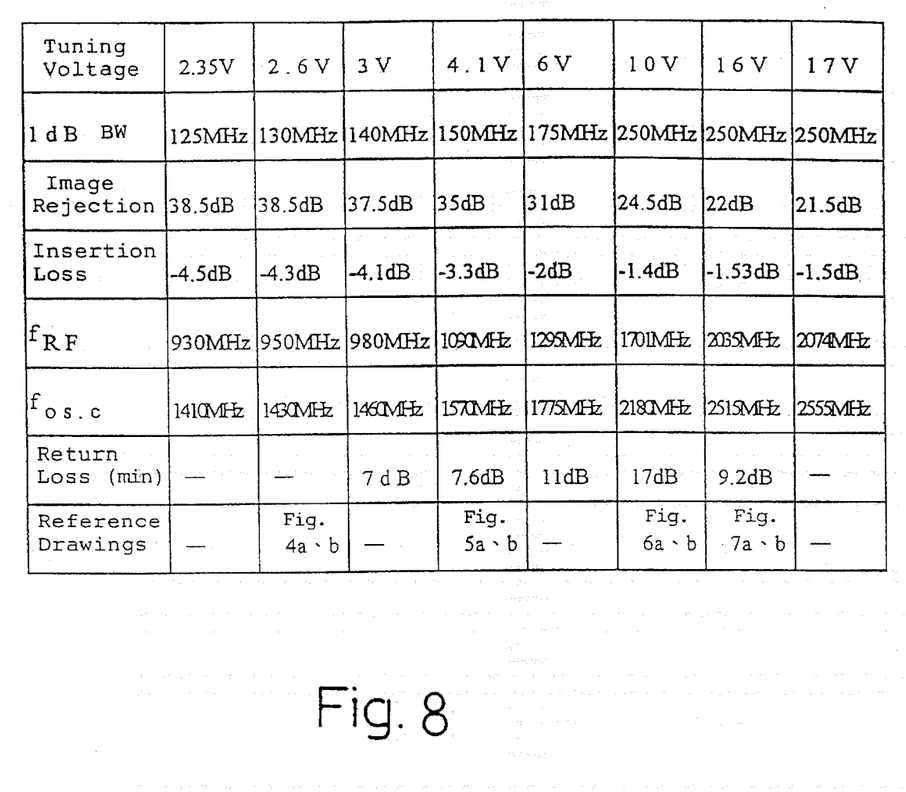
FIG. 8 is the experimental data of the synchronous tracking filter of the present invention.

To better explain that the present invention is able to effectively control the second distortion of the mixer and image signals interference, the experimentation curves of FIG. 4(a)–(b), 5(a)–(b), 6(a)–(b), and 7(a)–(b) are shown as proof. The resonance voltage is at 2.6v for FIGS. 4(a)–4(b) (the low input frequency is 950 MHz), while resonance voltage for FIGS. 5(a)–5(b) is at 4.1v (tracking the medium to high frequencies). The resonance voltage is at 10v for FIGS. 6(a)–6(b), and resonance voltage for FIGS. 7(a)–7(b) is at 16V (tracking high input frequency 2050 MHz). The image frequencies are those of input frequency plus 959.0 MHz, which is two (2) times the IF frequency of 479.5 MHz. FIG. 4(a) shows image rejection is 38.5 dB etc., and two (2) times the RF input frequencies would be suppressed by the tracking filter before feeding the RF input frequencies range to the mixer. From these experiments, it is shown that the present invention has met the requirements delineated under Table 1. The detailed experimental data are shown in FIG. 8, and the impedance for the tests was 75.

From the above explanation, the present invention of a synchronous tracking filter has been shown, from experiments, that it in fact achieves the goal of controlling image signals interference and mixer loss, which would not be easily achieved by the known products.

We claim:

1. A double resonant broadcast satellite tuner circuit comprising a synchronous tracking filter circuit having a doubly tuned resonant filter wherein said doubly tuned resonant filter comprises:

an input single-resonant circuit having an inductor first being connected in parallel to a first variable capacitor, which is formed of a varactor connected in series to a capacitor, and then being connected in series to a second variable capacitor, which is formed by a varactor connected in series to a capacitor;

an output single-resonant circuit having an inductor first being connected in parallel to a third variable capacitor, which is formed of a varactor connected in series to a capacitor and then being connected in series to a fourth variable capacitor, which is formed by a varactor connected in series to a capacitor; said input and said output single-resonant circuits, through an air coupling factor K, forming said doubly tuned resonant filter circuit.

2. The double resonant broadcast satellite tuner circuit of claim 1, wherein said input and output circuits respectively use capacitor taps to match the previous and post stages of said filter circuit.

3. The double resonant broadcast satellite tuner circuit of claim 1, wherein said input and output circuits respectively are used without a capacitor tap and impedance matching to couple to the previous and post stages of said filter circuit.

4. The double resonant broadcast satellite tuner circuit of claim 1, wherein said filter circuit is positioned between a radio frequency amplifier and a mixer of said broadcast satellite tuner circuit for tracking the radio frequency signals synchronously tuned with the tuning voltage of a local voltage controlled oscillator (VCO).

5. The double resonant broadcast satellite tuner circuit of claim 4, wherein the synchronous tuning is incorporated with the frequency changes of said VCO.

6. The double resonant broadcast satellite tuner circuit of claim 1, wherein said inductor of both said input and output circuits is a strip-shaped inductor plate.

7. The double resonant broadcast satellite tuner circuit of claim 1, wherein said inductor of both said input and output circuits is a printed strip-line.

* * * * *